(12) United States Patent
Marrs et al.

(10) Patent No.: US 10,874,027 B2
(45) Date of Patent: Dec. 22, 2020

(54) EQUIPMENT MODULE ADAPTER BLOCKS

(71) Applicant: VCE IP Holding Company LLC, Richardson, TX (US)

(72) Inventors: Samuel Maxwell Marrs, Bradley, IL (US); Alva Benjamin Eaton, Nottingham Park, IL (US)

(73) Assignee: EMC IP HOLDING COMPANY LLC, Round Rock, TX (US)

( * ) Notice: Subject to any disclaimer, the term of this patent is extended or adjusted under 35 U.S.C. 154(b) by 0 days.

(21) Appl. No.: 16/700,542

(22) Filed: Dec. 2, 2019

(65) Prior Publication Data
US 2020/0107465 A1 Apr. 2, 2020

Related U.S. Application Data

(60) Continuation of application No. 16/167,498, filed on Oct. 22, 2018, now Pat. No. 10,499,528, which is a division of application No. 14/727,370, filed on Jun. 1, 2015, now Pat. No. 10,111,355.

(51) Int. Cl.
*H05K 7/14* (2006.01)
*H05K 5/02* (2006.01)

(52) U.S. Cl.
CPC ......... *H05K 7/1489* (2013.01); *H05K 5/0221* (2013.01); *H05K 7/14* (2013.01)

(58) Field of Classification Search
CPC ....... H05K 7/1489; H05K 7/14; H05K 5/0221
See application file for complete search history.

(56) References Cited

U.S. PATENT DOCUMENTS

| | | | |
|---|---|---|---|
| 5,253,320 A | 10/1993 | Takahashi et al. |
| 5,363,465 A | 11/1994 | Korkowski et al. |
| 5,836,786 A | 11/1998 | Pepe |
| 6,077,113 A | 6/2000 | Lecomte |
| 6,347,715 B1 | 2/2002 | Drozdenko et al. |
| 6,568,542 B1 | 5/2003 | Chen |

(Continued)

OTHER PUBLICATIONS

Notice of Allowance and Fee(s) Due for U.S. Appl. No. 16/167,498 (dated Oct. 2, 2019).
Notice of Allowance and Fee(s) Due for U.S. Appl. No. 14/727,370 (dated Jun. 20, 2018).
Applicant-Initiated Interview Summary for U.S. Appl. No. 14/727,370 (dated Mar. 1, 2018).

(Continued)

*Primary Examiner* — Jinhee J Lee
*Assistant Examiner* — Theron S Milliser
(74) *Attorney, Agent, or Firm* — Jenkins, Wilson, Taylor & Hunt, P.A.

(57) ABSTRACT

Equipment racks, methods of installing equipment modules into equipment racks, and adaptor blocks for installing equipment modules into equipment racks are disclosed. In some examples, an equipment rack includes first and second rack rails and a carrier pack mounted to the first and second rack rails. The carrier pack includes first and second pack rails, each pack rail having a plurality of spaced apart mounting holes. The carrier pack includes first and second adapter blocks mounted to the first and second pack rails using the spaced apart mounting holes. Each of the first and second adapter blocks includes at least one post. The carrier pack includes an equipment module mounted to the first and second adapter blocks. The equipment module includes first and second spring loaded latches attached to the posts of the first and second adapter blocks.

13 Claims, 8 Drawing Sheets

(56) References Cited

U.S. PATENT DOCUMENTS

| | | | |
|---|---|---|---|
| 6,647,197 | B1 | 11/2003 | Marrs et al. |
| 6,840,815 | B2 | 1/2005 | Musolf et al. |
| 7,878,468 | B2 | 2/2011 | Chen et al. |
| 8,235,339 | B2 | 8/2012 | Selvidge et al. |
| 8,705,926 | B2 | 4/2014 | Giraud et al. |
| 8,710,369 | B2 | 4/2014 | Krietzman et al. |
| 9,008,485 | B2 | 4/2015 | Ramirez et al. |
| 10,111,355 | B1 | 10/2018 | Marrs et al. |
| 2005/0189855 | A1 | 9/2005 | Naue et al. |
| 2006/0160431 | A1 | 7/2006 | Herbst et al. |
| 2008/0089656 | A1 | 4/2008 | Wagner et al. |
| 2010/0200523 | A1 | 8/2010 | Henderson |
| 2012/0018605 | A1 | 1/2012 | Lacarra |
| 2013/0056432 | A1 | 3/2013 | Lin et al. |
| 2014/0094057 | A1 | 4/2014 | Ramey et al. |
| 2015/0147954 | A1 | 5/2015 | Marrs et al. |
| 2015/0177797 | A1 | 6/2015 | Butzer et al. |
| 2016/0157610 | A1* | 6/2016 | Chen .................. H05K 7/1489 248/219.3 |
| 2019/0059171 | A1 | 2/2019 | Marrs et al. |

OTHER PUBLICATIONS

Final Office Action for U.S. Appl. No. 14/727,370 (dated Dec. 21, 2017).

Applicant-Initiated Interview Summary for U.S. Appl. No. 14/727,370 (dated Nov. 7, 2017).

Non-Final Office Action for U.S. Appl. No. 14/727,370 (dated Aug. 4, 2017).

Advisory Action Before the Filing of an Appeal Brief for U.S. Appl. No. 14/727,370 (dated Apr. 25, 2017).

Final Office Action for U.S. Appl. No. 14/727,370 (dated Feb. 15, 2017).

Non-Final Office Action for U.S. Appl. No. 14/727,370 (dated Sep. 23, 2016).

Restriction and/or Election Requirement for U.S. Appl. No. 14/727,370 (dated Jul. 29, 2016).

Commonly-assigned, co-pending U.S. Appl. No. 14/727,370 for "Equipment Module Adapter Blocks," (Unpublished, filed Jun. 7, 2015).

* cited by examiner

EQUIPMENT MODULE ADAPTER BLOCKS

PRIORITY CLAIM

This application is a continuation of U.S. patent application Ser. No. 16/167,498 filed Oct. 22, 2018, which is a divisional of U.S. patent application Ser. No. 14/727,370 filed Jun. 1, 2015 (now U.S. patent Ser. No. 10/111,355), the disclosures of which is incorporated herein by reference in their entireties.

TECHNICAL FIELD

This specification relates generally to mounting structures, e.g., for mounting computer equipment into racks.

BACKGROUND

An equipment rack can be a standardized frame for mounting equipment modules. The equipment modules can be designed to standardized dimensions to fit in the rack, which can be convenient for mounting, cabling, and upgrading various equipment modules. For example, a data center facility can include server rooms with dense configurations of racks that house servers and other types of computer equipment. Some server equipment modules come with mounting bracket slides that attach to the sides of the modules and can be the main attachment points to racks. These mounting bracket slides can accept a unique spring loaded latch on the server equipment modules and a center screw to secure each side of the server modules.

SUMMARY

This specification describes equipment racks, methods of installing equipment modules into equipment racks, and adaptor blocks for installing equipment modules into equipment racks. In some examples, an equipment rack includes first and second rack rails and a carrier pack mounted to the first and second rack rails. The carrier pack includes first and second pack rails, each pack rail having a plurality of spaced apart mounting holes. The carrier pack includes first and second adapter blocks that are mounted to the first and second pack rails using the spaced apart mounting holes. Each of the first and second adapter blocks includes at least one post. The carrier pack includes an equipment module mounted to the first and second adapter blocks. The equipment module includes first and second spring loaded latches attached to the posts of the first and second adapter blocks.

DETAILED DESCRIPTION

An installer can install an equipment module into a carrier pack without mounting bracket slides even though the equipment module or some part of the equipment module is designed to mount to a rack using mounting bracket slides. The adapter block is useful, for example, for installing carrier packs of equipment that include multiple equipment modules integrated into a single unit. The carrier packs can be space restricted, leaving little to no room for mounting bracket slides. Carrier packs that include equipment modules that normally mount to a rack using mounting bracket slides can be installed, without the mounting bracket slides, by first installing adapter blocks and then mounting the equipment modules to the adapter blocks.

Figure 1:
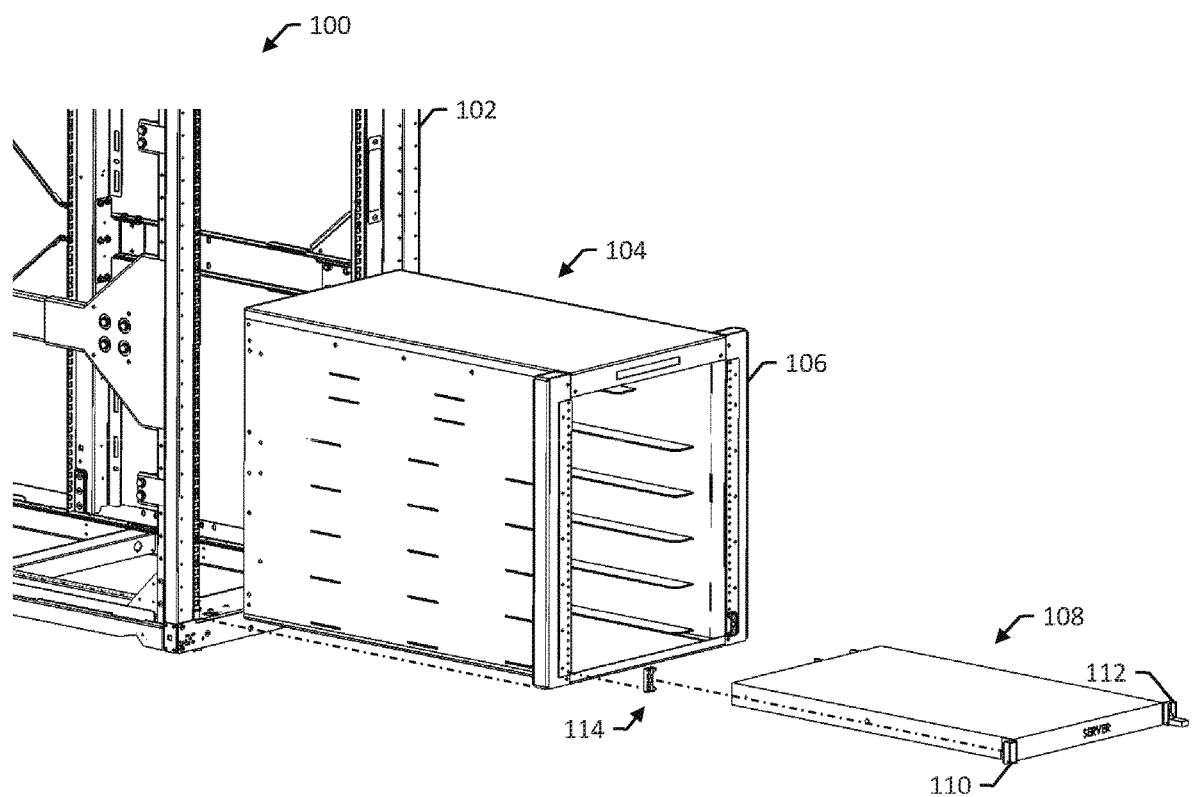
FIG. 1 shows a perspective view of an example equipment rack.

FIG. 1 shows a perspective view of an example equipment rack 100. The rack 100 includes a number of vertical rails 102 for mounting equipment modules. The vertical rails 102 can include first and second rails, e.g., a left rail on a left side and a right rail on a right side. The rack 100 can be constructed from metal or any appropriate material and dimensioned according to a standard. For example, the rack 100 can be standard 19-inch rack dimensioned according to Electronic Industries Alliance (EIA) EIA-310 standards. The rails 102 include a number of holes spaced apart at regular intervals, e.g., as specified by a standard.

A carrier pack 104 can be installed in the rack 100. The carrier pack 104 is a mechanical structure configured to hold multiple equipment modules. The carrier pack 104 can be made from metal or any appropriate material or combination of materials. The carrier pack can include one or more thin metal sheets for supporting the weight of the carrier pack 104 and/or individual equipment modules installed in the carrier pack 104.

The carrier pack 104 includes rails 106 that include a number of holes spaced apart at regular intervals, e.g., as specified by a standard (EIA-310E). The rails 106 can include first and second rails, e.g., a left rail on a left side and a right rail on a right side. Equipment modules can be installed in the carrier pack 104 using the rails 106, and then the carrier pack 104 itself can be installed into the rack 100 using the rails 106 of the carrier pack 104 and the rails 102 of the rack 100. The carrier pack 104 can be useful, e.g., in improving the speed and ease of installing multiple equipment modules into the rack 100.

FIG. 1 shows an example equipment module that is a server module 108 configured to mount to the rack 100 by mounting slides. The server module 108 has a one rack unit (RU) height (e.g., per a standard such as the EIA standard) and includes computer equipment configured to execute server software. The server module 108 includes left and right mounts 110 and 112 that each includes a spring loaded latch.

The left and right mounts 110 and 112 are configured to snap into the mounting slides and then accept a fastener (e.g., a screw) to secure the server module 108 to the rails 106. The mounts snap in when a spring loaded latch closes by action of the spring closing the latch behind or around a post. The left mount 110 is shown in a closed position, where it is snapped in, and the right mount 112 is shown in an open position, just prior to being snapped in, for purposes of illustration.

In some examples, the carrier pack 104 does not have space for mounting slides for mounting the server module 108. Moreover, in some examples, the left and right mounts 110 and 112 are secured to the server module 108 in such a way as to make it inconvenient to replace the left and right mounts 110 and 112. For example, the left and right mounts 110 and 112 can be riveted to a housing of the server module 108.

To improve the speed and ease of installation of the server module 108 into the carrier pack 104, an installer can first install adapter blocks 114 to the rails 106 of the carrier pack 104. Then, the installer can mount the server module 108 to the adapter blocks 114. The spring loaded latches of the server module 108 attach to the adapter blocks 114, e.g., by snapping onto posts of the adapter blocks 114 by action of the spring. The spring loaded latches can snap-in, e.g., behind or around the posts. Finally, the installer can mount the carrier pack 104 to the rack 100.

The carrier pack 104 can be a converged infrastructure (CI) system or one or more components of a CI system. A CI system, such as a Vblock® System from VCE Company, LLC, can include a single computing platform unit associated with multiple equipment modules of physical CI components and related software for performing virtualization, cloud computing, and/or other information technology (IT) functions. The CI system can include compute components, storage components, and network components.

Moreover, a CI system can include multiple computing system resource components, such as physical resources and/or virtual resources, in a preconfigured or prepackaged computing platform, where some resource components are developed and/or manufactured by multiple entities. For example, a CI system can include data storage devices, servers (e.g., web servers, file servers, etc.), networking equipment, and software for managing physical resources and/or virtualized resources (e.g., virtual servers).

Figure 2:
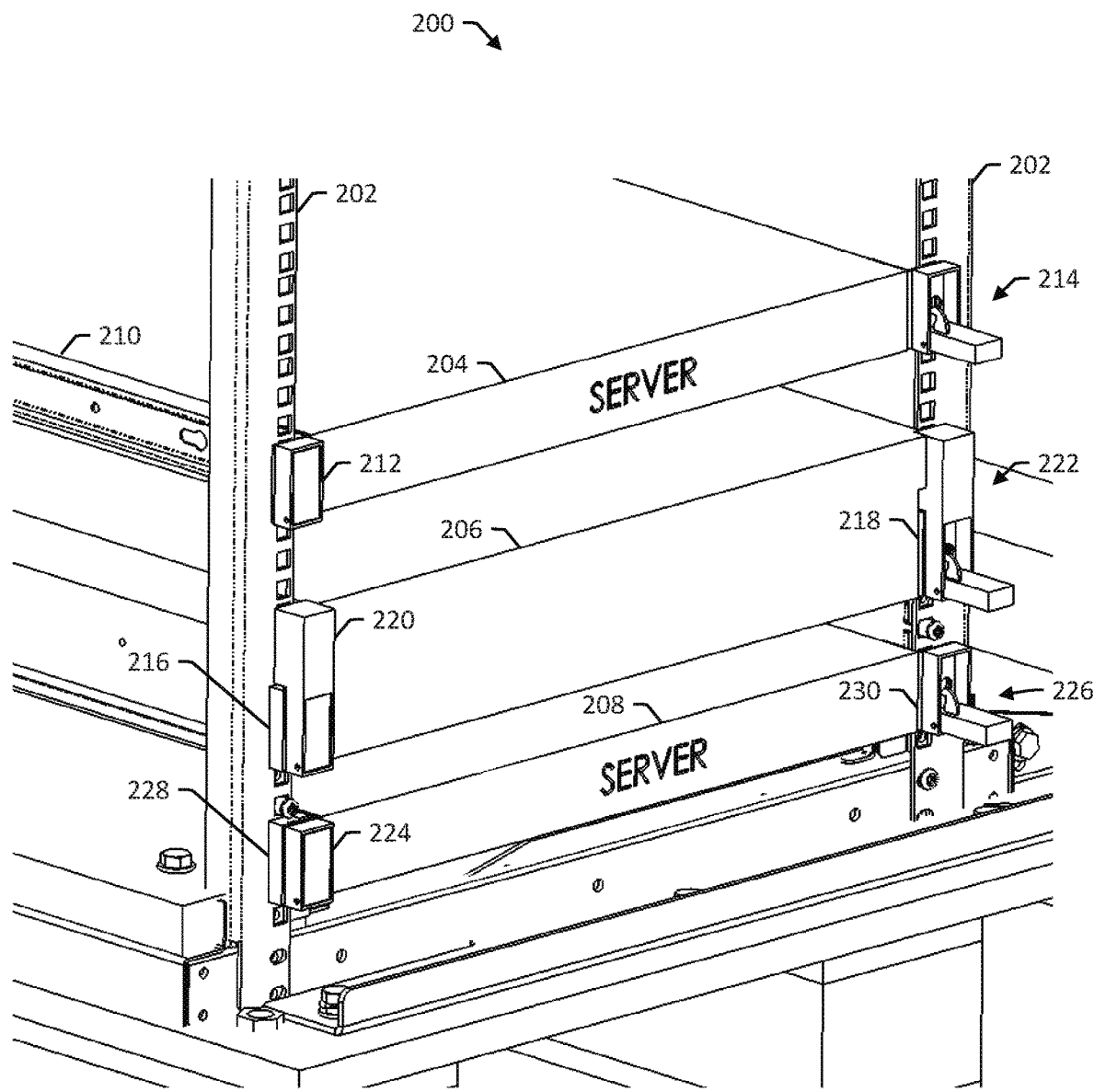
FIG. 2 illustrates mounting of equipment modules to rails using both mounting slides and adapter blocks.

FIG. 2 is a perspective view of an example rack 200. The example rack 200 shows the mounting of equipment modules to rails 202 using both mounting slides and adapter blocks for purposes of illustration.

The rack 200 has three example equipment modules 204, 206, and 208 mounted to the rails 202. The equipment modules 204, 206, and 208 can include any appropriate type of computer equipment, e.g., processors, memory, storage, networking, and the like. The equipment modules 204, 206, and 208 can be dimensioned according to a standard that matches the standard of the rack 200.

The first equipment module 204 has a one rack unit (RU) height, e.g., as defined by a standard. The first equipment module is configured to mount to mounting slides 210 using left and right mounts 212 and 214 that each include a spring loaded latch.

The second equipment module 206 is mounted to the rack 200 using left and right adapter blocks 216 and 218. In general, the adapter blocks 216 and 218 are not handed, and the terms "left" and "right" are used to designate that one is on the left side and one is on the right side. For example, the adapter blocks can be identical, and they can be configured to be able to be mounted on the left or right rail by flipping the part.

The left and right adapter blocks 216 and 218 are configured to be mounted to the rails 202, e.g., by fasteners such as screws, and then to accept the spring loaded latches of left and right mounts 220 and 222. The left and right adapter blocks 216 and 218 can each include a hole that is located and sized so that screws can secure the left and right mounts 220 and 222 to the rails 202. The left mount 220 includes an indentation sized so that, when the equipment module 206 is mounted, the left mount 220 is flush with the rail 202 and the adapter block 216.

The third equipment module is an example server 208 that includes left and right mounts 224 and 226 that each include a spring loaded latch. The server 108 can be mounted to the rack 200 using left and right adapter blocks 228 and 230. Using adapter blocks in this situation can useful, e.g., where it is otherwise undesirable to use mounting slides. The left mount 224 does not contact the rail 202, and one entire side of the left mount 224 is flush with the adapter block 228. The left and right mounts 224 and 226 can have any appropriate shape for mounting to the adapter blocks 228 and 230.

Figure 3A:
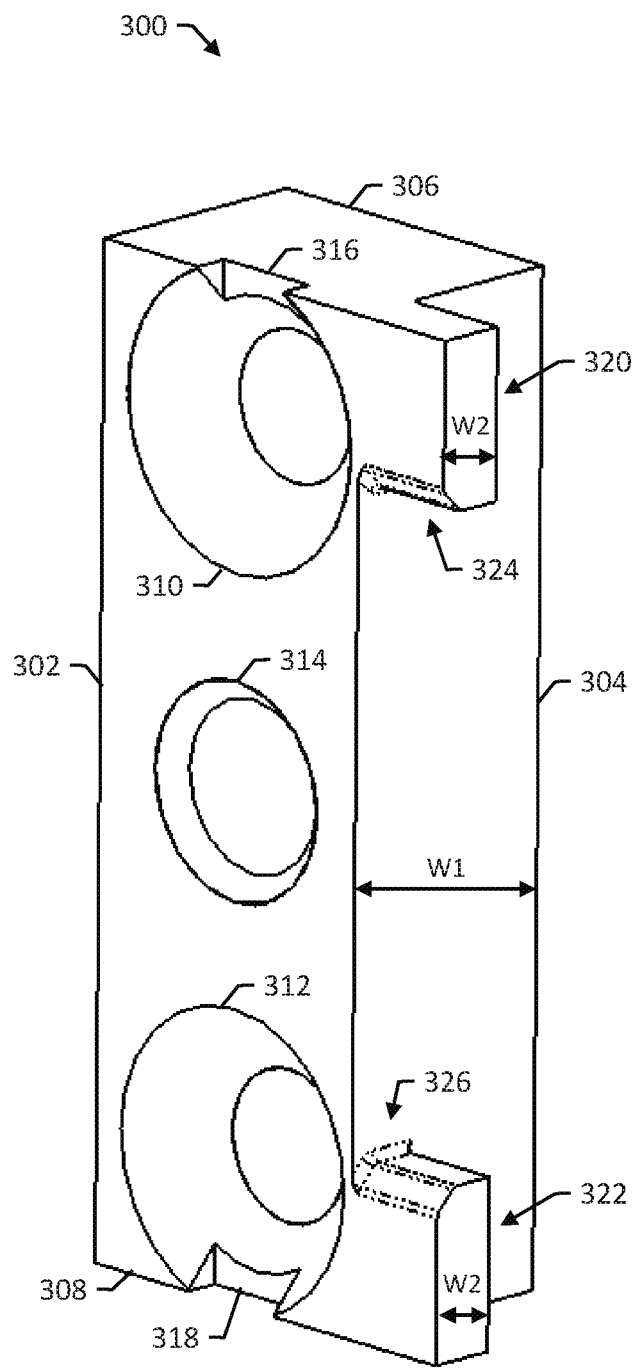
FIG. 3A is a front perspective view of an example adapter block.
Figure 3B:
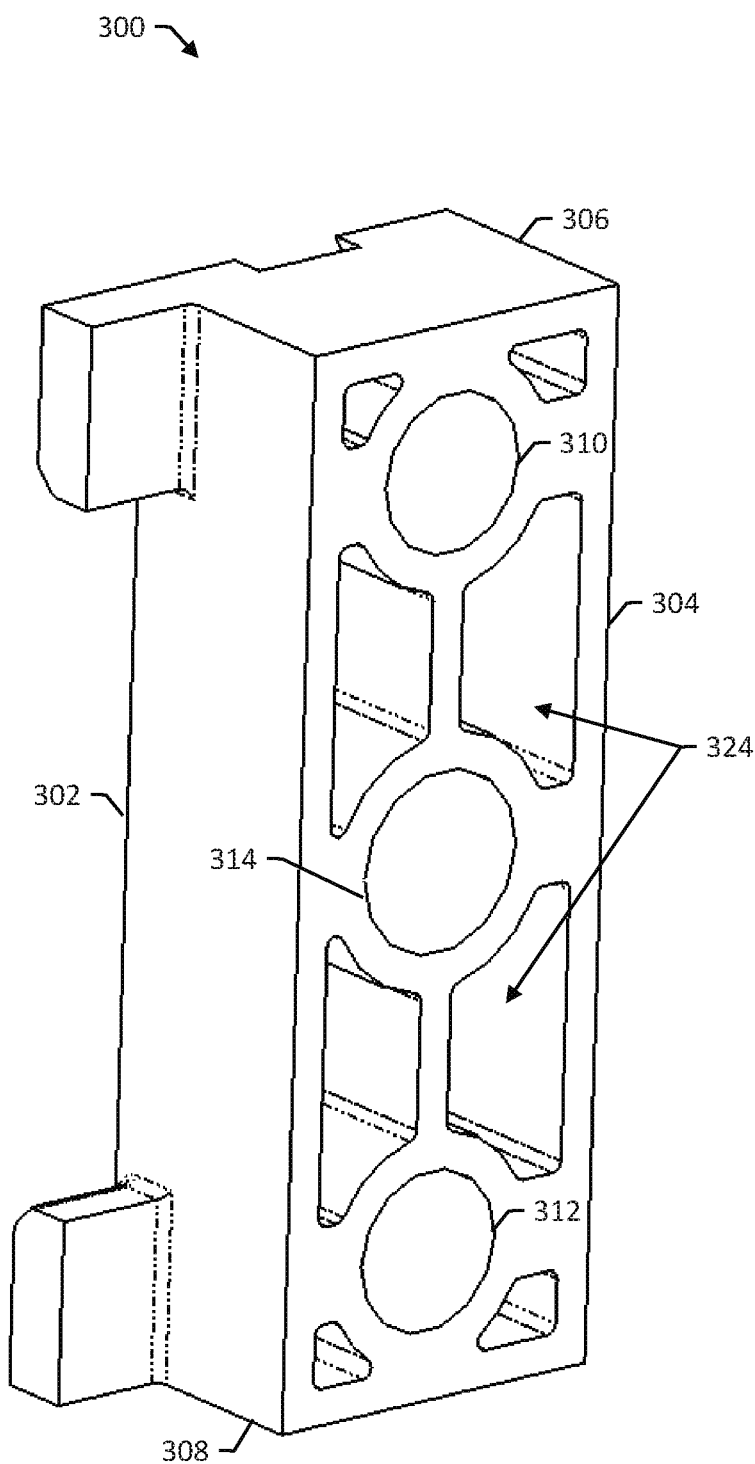
FIG. 3B is a back perspective view of the example adapter block.

FIG. 3A is a front perspective view of an example adapter block 300. FIG. 3B is a back perspective view of the example adapter block 300. The adapter block 300 has front and back sides 302 and 304 and top and bottom sides 306 and 308. The adapter block 300 includes top and bottom holes 310 and 312 that are spaced apart, e.g., to match holes on vertical rails of a rack having holes spaced apart according to a standard. The adapter block 300 also includes at least one central hole 314. The terms "front," "back," "top," and "bottom" are used for convenience to indicate different sides (e.g., opposing sides) of the example adapter block 300.

The top and bottom holes 310 and 312 can include first and second notches, e.g., top and bottom notches 316 and 318, which can be useful, e.g., for secure mounting with certain kinds of equipment module mounts. The adapter block 300 can include cavities 324 within the adapter block 300 that can be useful, e.g., to reduce the weight and cost of the adapter block 300. The adapter block 300 can be formed of any appropriate material or combination of materials. In some examples, the adapter block 300 is formed of metal and manufactured using die casting (e.g., die casted metal).

The adapter block 300 includes first and second posts, e.g., top and bottom posts 320 and 322. The posts 320 and 322 are configured so that spring loaded latches can slide over the posts 320 and 322 and then snap onto the adapter block 300. For example, the posts 320 and 322 can extend away from a side of the adapter block 300 and have a width W2, from the front side 302 towards the back side 304, that is less than a width W1 of the adapter block 300. The posts 320 and 322 can include tapered edges 324 and 326 facing the front side 302 of the adapter block 300 to aid in allowing spring loaded latches to push past the posts 320 and 322 and snap into place behind the posts 320 and 322.

Figure 4:
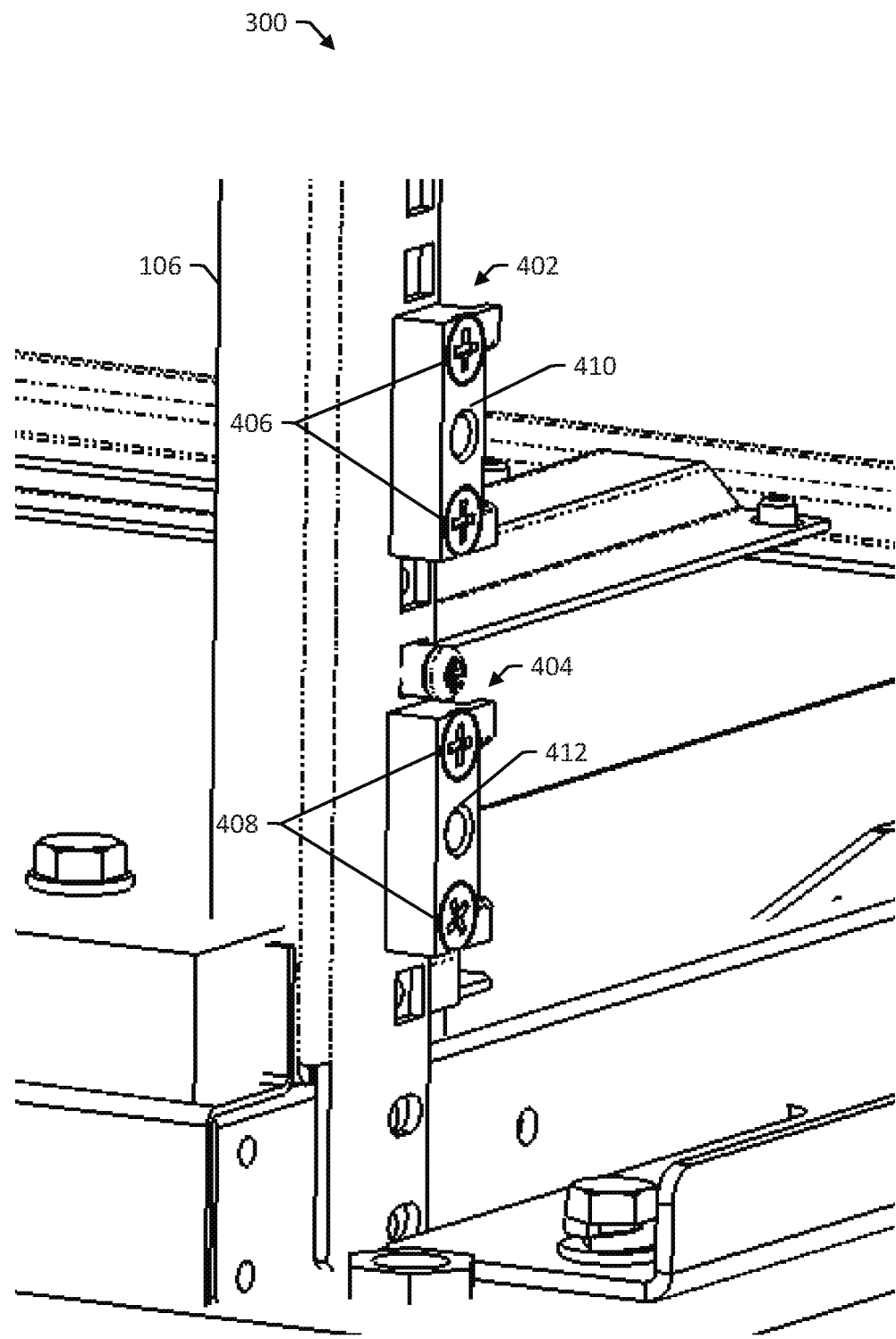
FIG. 4 is a perspective view of two adapter blocks mounted to a rail.

FIG. 4 is a perspective view of two adapter blocks 402 and 404 mounted to a rail 102. The adapter blocks 402 and 404 are mounted to the rail 106 of the carrier pack 104 using fasteners 406 and 408, e.g., one screw for each of top and bottom holes in the adapter blocks 402 and 404. The adapter blocks 402 and 404 include center holes 410 and 412 which line up over holes in the rail 106 so that the adapter blocks 402 and 404 can receive screws to secure equipment modules to the adapter blocks 402 and 404 and the rail 106.

Figure 5:
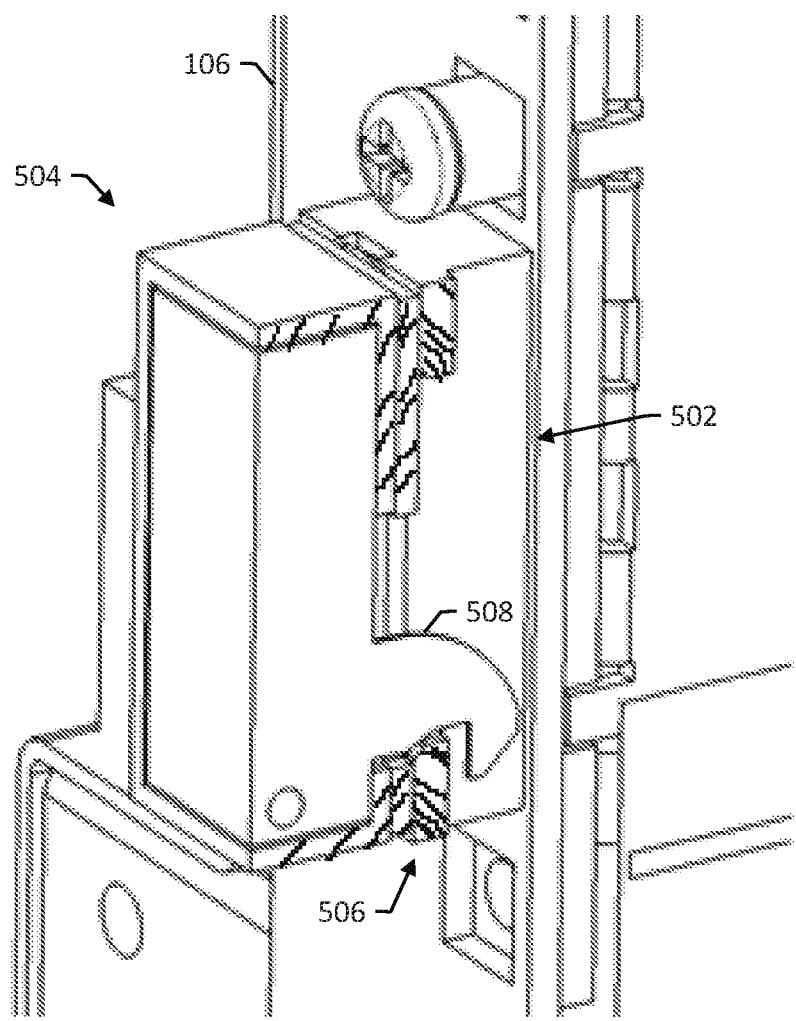
FIG. 5 is a cross-sectional view of an equipment module mount that is mounted to an adapter block that is mounted to a rail.

FIG. 5 is a cross-sectional view of an equipment module mount 504 that is mounted to an adapter block 502 that is mounted to a rail 106 of the carrier pack 104. The equipment module itself is not shown for purposes of illustration. The mount 504 includes a spring loaded latch 508 that snaps into place behind a post 506 of the adapter block 502. The post 506 allows the spring loaded latch 508 to hold the equipment module in place until one or more screws can be installed to secure the equipment module in the carrier pack 104.

Figure 6:
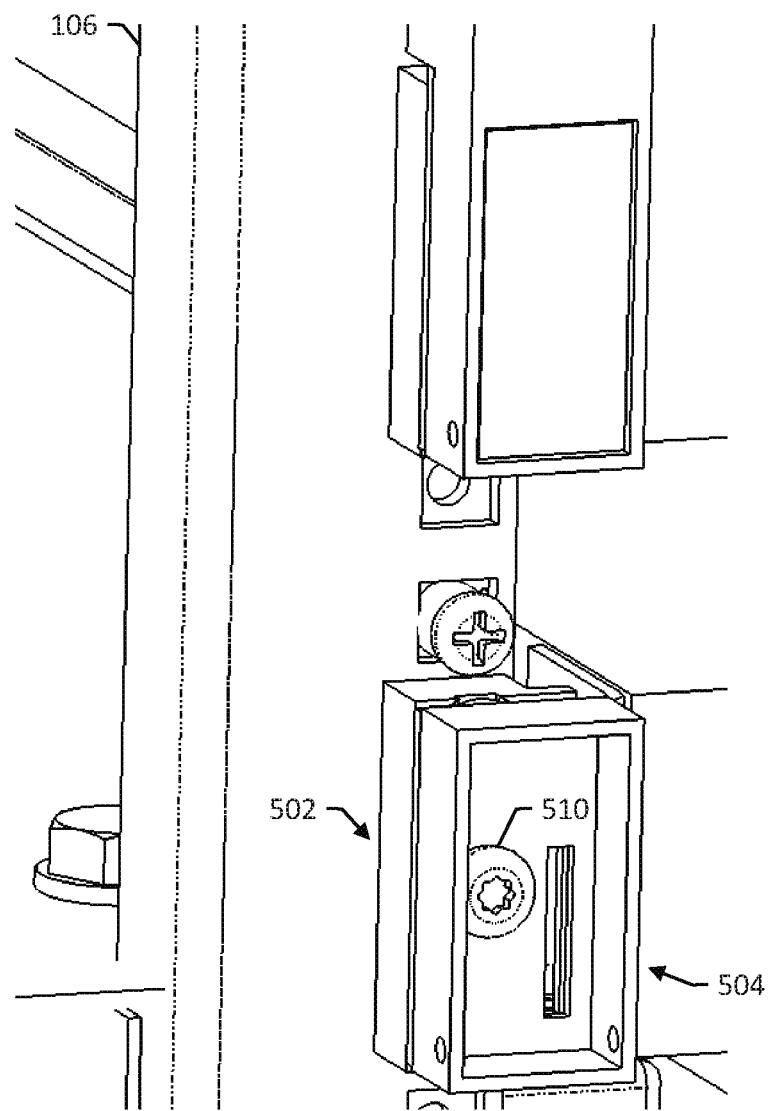
FIG. 6 is a detailed view of the adapter block after a screw has been installed to secure the equipment module to the rack.

FIG. 6 is a detailed view of the adapter block 502 from FIG. 5 after a screw 510 has been installed to secure the equipment module to the rack. A back side of the mount 504 and the equipment module for the mount 504 are not shown for purposes of illustration. The spring loaded latch 508 can stay snapped in to the adapter block 502 after installing the screw 510 so that both the spring loaded latch 508 and the screw 510 hold the equipment module in the rack. In some examples, the screw 510 is better suited than the spring loaded latch 508 for long term mounting, so the spring loaded latch 508 is primarily used to hold the equipment module in place while the screw 510 is installed.

Figure 7:
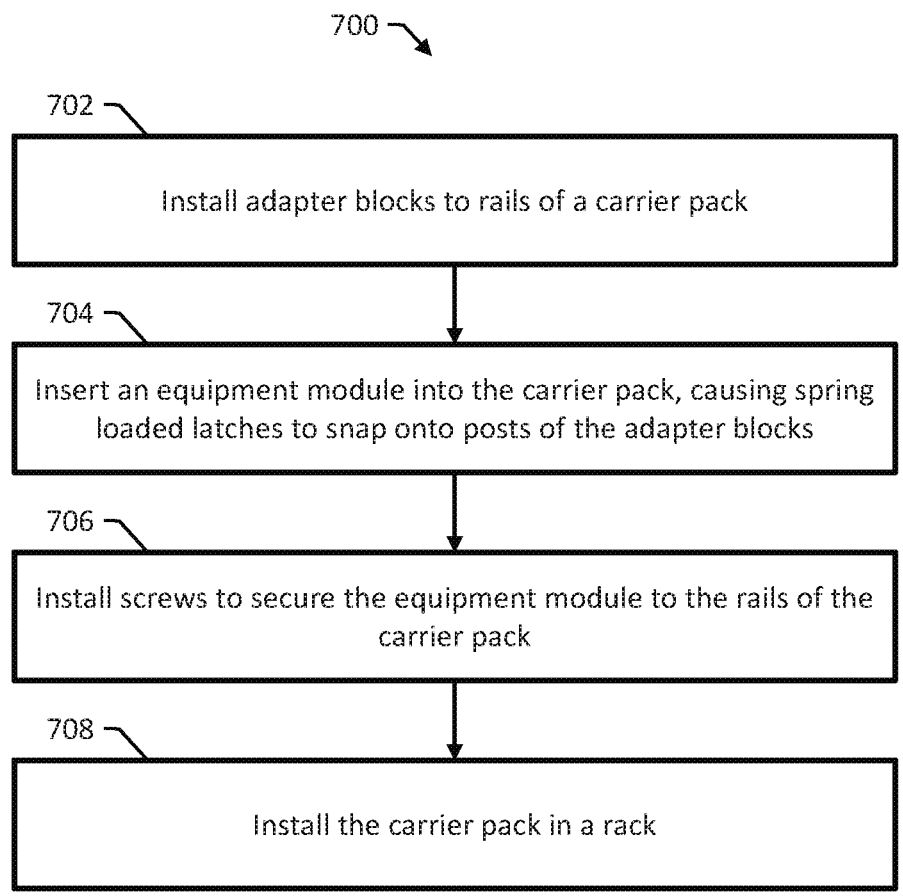
FIG. 7 is a flow diagram of a method for installing an equipment module in a rack.

FIG. 7 is a flow diagram of a method 700 for installing a carrier pack in a rack. An installer performs the method. The installer can be, e.g., a system engineer or service technician. The rack can be a standardized equipment rack and the carrier includes at least one equipment module that includes mounts having spring loaded latches, e.g., as discussed above with reference to FIGS. 1 and 2.

In block 702, the installer installs adaptor blocks to rails of the carrier pack. For example, the installer can secure the top and bottom sides of the adaptors using screws that pass through top and bottom holes of the adapter blocks and corresponding holes on the rails of the carrier pack.

In block 704, the installer inserts the equipment module into the carrier pack. The force of the insertion causes the spring loaded latches of the mounts to attach to the adaptor blocks, e.g., by pushing past posts on the adaptor blocks and snapping onto the posts. The spring loaded latches can hold the equipment module in place temporarily.

In block 706, the installer installs screws in center holes to secure the equipment module to the rails of the carrier pack. The screws pass through the mounts, the adapter blocks, and the holes of the rails.

In block 708, the installer installs the carrier pack in a rack. For example, the installer can use screws or other fasteners to secure the rails of the carrier pack to the rails of the rack. The installer can take other steps to complete installation as appropriate. For example, the installer can run cables, make attachments at another end of the rack, and continue installing other equipment modules.

Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims. It is understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for installing an equipment module in an equipment rack, the method comprising:

installing a first adapter block to a first pack rail of a carrier pack using one or more first adapter fasteners to secure the first adapter block to a first plurality of spaced apart mounting holes of the first pack rail, wherein the first adapter block comprises at least one post;

installing a second adapter block to a second pack rail of the carrier pack opposite to the first adapter block using one or more second adapter fasteners to secure the second adapter block to a second plurality of spaced apart mounting holes of the second pack rail, wherein the second adapter block comprises at least one post;

inserting an equipment module into an opening of the carrier pack between the first and second adapter blocks, causing first and second spring loaded latches of the equipment module to attach to the posts, thereby holding the equipment module in place against the first and second adapter blocks; and installing the carrier pack in the equipment rack.

2. The method of claim 1, wherein the carrier pack comprises a converged infrastructure (CI) system, wherein the CI system includes at least one server having the first and second spring loaded latches installed on a housing of the server.

3. The method of claim 1, wherein each of the first and second adapter blocks has a first width from a front side to a back side, and wherein each post has a second width, smaller than the first width, from the front side towards the back side, and wherein inserting the equipment module into the carrier pack comprises causing the first and second spring loaded latches to push past the posts and snap onto the posts.

4. The method of claim 3, wherein each of the posts comprises a tapered edge tapering from the front side to the back side.

5. The method of claim 1, wherein each of the first and second adapter blocks comprises a center hole, and wherein the method includes mounting the equipment module to the first and second adapter blocks using first and second fasteners passing through the center holes of the first and second adapter blocks.

6. The method of claim 1, wherein the first adapter block comprises first and second holes that are aligned over a respective pair of the first plurality of spaced apart mounting holes, wherein the second adapter block comprises first and second holes that are aligned over a respective pair of the second plurality of spaced apart mounting holes, wherein installing the first adapter block comprises mounting the first adapter block using the one or more first adapter fasteners passing through the first and second holes and through the respective pair of the first plurality of spaced apart mounting holes to mount the first adapter block to the first pack rail, and wherein installing the second adapter block comprises mounting the second adapter block using the one or more second fasteners passing through the first and second holes and through the respective pair of the second spaced apart mounting holes to mount the second adapter block to the second pack rail.

7. The method of claim 1, wherein each of the first and second adapter blocks comprises first and second posts, and wherein the equipment module comprises first and second mounts and each of the first and second mounts comprises a top spring loaded latch snapped in behind a respective first post and a bottom spring loaded latch snapped in behind a respective second post.

8. An adapter block configured for installing an equipment module in an equipment carrier pack comprising:

first and second sides and front and back sides;

first and second holes through the adapter block from the front side to the back side, wherein the first and second holes are configured to receive adapter fasteners therethrough for mounting the adapter block to a plurality of spaced apart mounting holes of a pack rail of an equipment carrier pack;

at least one center hole, between the first and second holes, through the adapter block from the front side to the back side, wherein the center hole is configured to receive a fastener therethrough for mounting the adapter block to an equipment module; and at least one post extending away from the adapter block, wherein each of the at least one post is configured to engage a spring loaded latch of the equipment module.

9. The adapter block of claim 8, comprising first and second posts.

10. The adapter block of claim 8, wherein the at least one post comprises a tapered edge tapering from the front side to the back side.

11. The adapter block of claim 8, wherein the top hole comprises a top notch and the bottom hole comprises a bottom notch.

12. The adapter block of claim 8, wherein the adapter block is formed of die casted metal.

13. The adapter block of claim 8, wherein the adapter block comprises a plurality of cavities in the adapter block.

* * * * *